United States Patent
Yamamoto et al.

(10) Patent No.: US 6,902,824 B2
(45) Date of Patent: Jun. 7, 2005

(54) COPPER FOIL AND METAL FOIL WITH CARRIER FOIL FOR PRINTED WIRING BOARD, AND SEMI-ADDITIVE PROCESS FOR PRODUCING PRINTED WIRING BOARD USING THE SAME

(75) Inventors: Takuya Yamamoto, Ageo (JP); Takashi Kataoka, Ageo (JP); Yutaka Hirasawa, Ageo (JP); Naotomi Takahashi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 10/059,222

(22) Filed: Jan. 31, 2002

(65) Prior Publication Data

US 2002/0079133 A1 Jun. 27, 2002

(51) Int. Cl.$^7$ ................................ B32B 7/12
(52) U.S. Cl. ................ 428/548; 428/336; 428/352; 428/607; 428/615; 428/637; 428/647; 428/675; 428/680
(58) Field of Search ................ 428/548, 336, 428/352, 607, 615, 637, 647, 675, 680, 618, 621, 626, 612; 205/111

(56) References Cited

U.S. PATENT DOCUMENTS

| | | | | |
|---|---|---|---|---|
| 3,220,897 A | * | 11/1965 | Conley et al. | |
| 3,998,601 A | * | 12/1976 | Yates et al. | 29/195 |
| 4,189,331 A | * | 2/1980 | Roy | 148/6.31 |
| 4,640,747 A | * | 2/1987 | Ueno et al. | 204/37.1 |
| 4,997,516 A | * | 3/1991 | Adler | 156/630 |
| 5,366,814 A | * | 11/1994 | Yamanishi et al. | 428/607 |
| 5,919,379 A | * | 7/1999 | Thorpe | 216/13 |
| 6,183,880 B1 | * | 2/2001 | Yoshioka et al. | 428/607 |
| 6,270,889 B1 | * | 8/2001 | Kataoka et al. | 428/352 |
| 6,319,620 B1 | * | 11/2001 | Kataoka et al. | 428/626 |
| 6,447,929 B1 | * | 9/2002 | Wang et al. | 428/604 |
| 6,479,170 B2 | * | 11/2002 | Takahashi et al. | 428/674 |

FOREIGN PATENT DOCUMENTS

| | | |
|---|---|---|
| EP | 0930811 A1 * | 7/1999 |
| JP | 05-138807 | 6/1993 |
| JP | 06-169168 | 6/1994 |
| JP | 07-231161 | 8/1995 |
| JP | 08-001859 | 1/1996 |
| JP | 08-316631 | 11/1996 |
| JP | 11-317574 | 11/1999 |

* cited by examiner

*Primary Examiner*—Cathy F. Lam
(74) *Attorney, Agent, or Firm*—Rothwell, Figg, Ernst & Manbeck, P.C.

(57) ABSTRACT

This invention provides a metal foil and an etching process which overcomes the problem of etching of the copper foil layer and the plating copper layer formed on a metal clad laminate during the conventional semi-additive process for producing printed wire boards. In the present invention, the metal foil and the metal foil with carrier foil include a nickel or tin layer 0.5 to 3 μm thick formed on the external surface of a metal clad laminate which protects the surface of the plated layer during the final flash etching of the copper foil layer.

5 Claims, 10 Drawing Sheets

COPPER FOIL AND METAL FOIL WITH CARRIER FOIL FOR PRINTED WIRING BOARD, AND SEMI-ADDITIVE PROCESS FOR PRODUCING PRINTED WIRING BOARD USING THE SAME

FIELD OF THE INVENTION

This invention relates to metal foil with carrier foil and a semi-additive process for producing printed wiring boards using the same.

DESCRIPTION OF THE RELATED ART

A pattern plating for producing printed wiring boards has been widely used in particular in the application of forming fine circuits. The conventional semi-additive process using electrolytic metal foil carrier foil, which has provided a basis for this invention, is as described below. Hereunder the process will be described with reference to FIGS. 9 and 10.

The electrolytic metal foil carrier foil herein mentioned has been used as a base material on the production of printed wiring boards used widely in the fields of electric and electronic industries. In general, the electrolytic copper foil is bonded to a glass-epoxy base material, a phenol base material, or a polymer insulating base material such as polyimide by the hot press lamination to give a metal clad laminate which is used for producing printed wiring boards. The electrolytic metal foil carrier foil is such that it is constructed by bonding carrier foil and electrolytic copper foil facing to each other and that it is press-formed with the carrier foil bonded thereto and the carrier foil can be removed just before forming a copper circuit by etching. Thus wrinkling can be prevented from occurring in the electrolytic copper foil during the handling and pressing of the same and the surface contamination of the metal clad laminate to be formed can also be prevented.

Generally the electrolytic metal foil carrier foil can be divided into two major types: peelable and etchable. The difference between the two is in a word that in the peelable electrolytic copper foil, the carrier foil is removed by the peeling process after press forming, whereas in the etchable electrolytic copper foil, the carrier foil is removed by the etching process after press forming.

This electrolytic metal foil carrier foil undergoes hot pressing to produce a single sided metal clad laminate, a double sided metal clad laminate or a multilayer metal clad laminate consisting of three or more layers. In the production of these laminates, even if the copper foil layer is extremely thin, since the carrier foil supports the copper foil, wrinkling is prevented from occurring in the copper foil, thus cracks are effectively prevented from occurring in the copper foil which may occur at wrinkle portions if there exist wrinkles thereon.

Accordingly, the carrier foil is situated on the surface of the metal clad laminate thus produced on one side or both sides thereof to which the electrolytic copper foil is bonded. Thus the first thing to do after hot pressing is to remove the carrier foil, for the peelable foil, by peeling and, for the etchable foil, by etching.

On completing the removal of the carrier foil, the copper foil layer appears on the surface of the metal clad laminate. Then a plating resist layer is formed on the surface of the copper foil layer. After uniformly forming a plating resist layer on the surface of the copper foil layer, the plating resist layer undergoes exposure and development to form a pattern for forming a circuit. This development is performed so that the plating resist will remain only at a portion of the copper foil where a circuit is not formed (herein-before and -after referred to as "circuit unformed portion").

After the development is completed, then a pattern copper layer is formed on the surface of the copper foil layer by plating copper only at a portion where the plating resist has not been formed and the copper foil layer is exposed to form a circuit (herein-before and -after referred to as circuit formed portion).

After the formation of the pattern copper layer, the plating resist layer on the circuit unformed portion is swelled with an alkaline solution and removed. In this stage, the copper foil layer still remains on the bottom of the circuit unformed portion, and the metal clad laminate having been subjected to the above processes is still incomplete as a printed wiring circuit.

Then finally short-time etching is performed with a copper etchant to remove the copper foil layer remaining on the bottom of the circuit unformed portion. This etching process is commonly called flash etching process. After this, a required solder mask etc. is formed and a printed wiring board is finished. The process of producing printed wiring boards described above is referred to as semi-additive process among those skilled in the art and has been considered to be very advantageous to printed wiring boards of fine pitch pattern.

The conventional semi-additive process described above, however, has disadvantages in that it is difficult to avoid etching the surface of a plated layer during the final flash etching of the copper foil layer remaining on the bottom of the circuit unformed portion, because the plated layer is formed as a pattern copper layer and consequently consists of copper.

As a result, the edge portion of a circuit is attacked by the etchant and the planar area of the circuit top becomes small, as shown FIG. 10(*f*). A smaller planar area of the circuit top means a smaller mounting area for mounting components which makes the process control of component mounting more difficult.

It has been said that the rate of attacking the edge portion of a circuit by an etchant is 6 to 8 times as fast as that of etching the planar portion due to its shape effect, provided that the same etchant is used and the conditions, such as the temperature and the concentration, of the etchant are the same.

Accordingly, a semi-additive process has been widely desired which enables the formation of a circuit of which cross section is more stably rectangular.

SUMMARY OF THE INVENTION

Thus, the inventors of this invention hit upon a solution to the aforementioned problems such that a metal of different type from copper is used instead of the copper foil layer by allowing the copper to remain undissolved during flash etching, so as to selectively flash-etch the metal of different type from copper. The term "flash etching" herein used is sometimes referred to as "quick etching" among those skilled in the art, and it is used as a term expressing etching of a different type from the circuit etching; specifically, the flash etching is to etch the metal component remaining on the bottom of the gap portion between circuits to be formed, whereas the circuit etching is to etch the copper foil used in a metal clad laminate so as to directly obtain a circuit configuration.

The term "metal layer" herein-before and -after used is the one which expresses the portion formed of a metal other than copper and is used to differentiate from the copper foil layer and the plating copper layer. The term "metal layer" used in this invention means a portion formed of nickel or tin or their alloys. In the following the copper foil etc. according to this invention will be described. It is the use of the copper foil and the metal foil with carrier foil described below that enables the stable processing of the semi-additive process for producing a printed wiring board which the inventors of this invention propose.

Basically, the copper foil or the metal foil with carrier foil according to the attached claims is used so as to carry out the semi-additive process according to this invention. One example of such foil is copper foil for a printed wiring board which includes a nodulated surface having copper microparticles attached thereto, the copper foil being characterized in that the nodulated surface has a nickel or tin layer 0.5 to 3 µm thick formed thereon.

Figure 1:
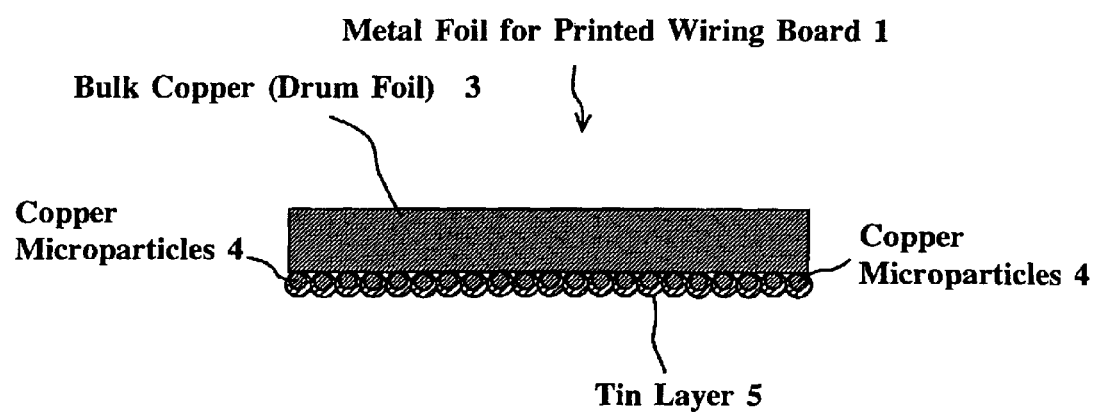
FIG. 1 is a schematic cross-sectional view of copper foil for a printed wiring board according to this invention.

First, the copper foil according to the attached claims will be described. The term "a nodulated surface to which copper microparticles have been attached" herein used means the portion of the copper foil surface to which copper microparticles have been attached by an electrolytic method so as to obtain an anchor effect for improving the bond strength of the copper foil which is to be pressed on a prepreg by hot pressing in the production of a metal clad laminate. The term "copper foil" herein used is the concept including both electrolytic copper foil, which is obtained by an electrolytic method and is widely used, and rolled copper foil, which is obtained by rolling. FIG. 1 is a schematic cross-sectional view of copper foil for a printed wiring board according to this invention, showing the layer construction of the same. In the same figure, the portion referred to as bulk copper corresponds to copper foil, and it is also referred to as drum foil when the copper foil is electrolytic copper foil.

A first characteristic of the copper foil for a printed wiring board according to this invention is that a nickel layer or a tin alloy layer, as a metal foil layer, is formed on the copper foil surface on which the aforementioned copper microparticles have already been formed. An electrolytic method as a wet method, an evaporation method as a dry method, etc. can be adopted to form the nickel or tin alloy layer. However, from the viewpoint of controlling the thickness of the film formed, the electrolytic method is considered to be advantageous over the evaporation method. The reason a nickel layer or a tin layer is selected for the metal foil layer is that at present nickel and tin are considered to be the metals of different types from copper which obviously enable the selective etching with copper and moreover which are highly reliable in maintaining the quality of a printed wiring board to be produced.

Forming a nickel or tin layer on the copper foil surface on which copper microparticles have already been formed provides a metal layer to which irregularity of the copper foil surface, due to the copper microparticles, is transferred. When producing a metal clad laminate using this copper foil, the metal layer of the copper foil is embedded into the base material in such a manner as to conform to the irregularity due to the copper microparticles. Thus, when completing the etching and removing of the copper foil portion and forming a copper layer again by plating, the bonding characteristic between the copper plating layer and the metal layer, to which irregularity of the copper foil surface due to the copper microparticles is transferred, is improved, as described later.

A second characteristic of the copper foil for a printed wiring board according to this invention is that the thickness of the nickel or tin layer formed as a metal layer is 0.5 to 3 µm. The reason the range of the metal layer thickness is defined as above is that, when using the copper foil in the printed wiring board application, the above range is optimal so as to allow the metal layer to be uniform and free from defects, be in a conductive state, and be easily removed by flash etching. It is possible to form a metal layer, for example, 0.1 µm thick; however, taking into consideration that the metal layer is formed on the nodulated surface of copper foil, the metal layer less than 0.5 µm thick lacks uniformity particularly when it is formed by an electrolytic method. And even if a film excellent in uniformity is formed by a dry method such as evaporation method, the film thickness is required to be at least 0.5 µm. Because when using the metal layer as a conductor for subsequent copper plating, if the metal layer is less than 0.5 µm thick, the initial resistance increases and the electrodeposition speed becomes low. On the other hand, the upper limit of the film thickness is supposed to be determined in such a manner as to fall within the reasonable range in terms of the printed wiring board production technology; however, the metal layer more than 3 µm thick requires a longer time for etching for reasons related to process control on printed wiring board manufacture and causes an overetching phenomenon in the metal layer portion, which is in turn likely to cause excess etching in the interface of the plated layer and the metal layer.

Figure 2:
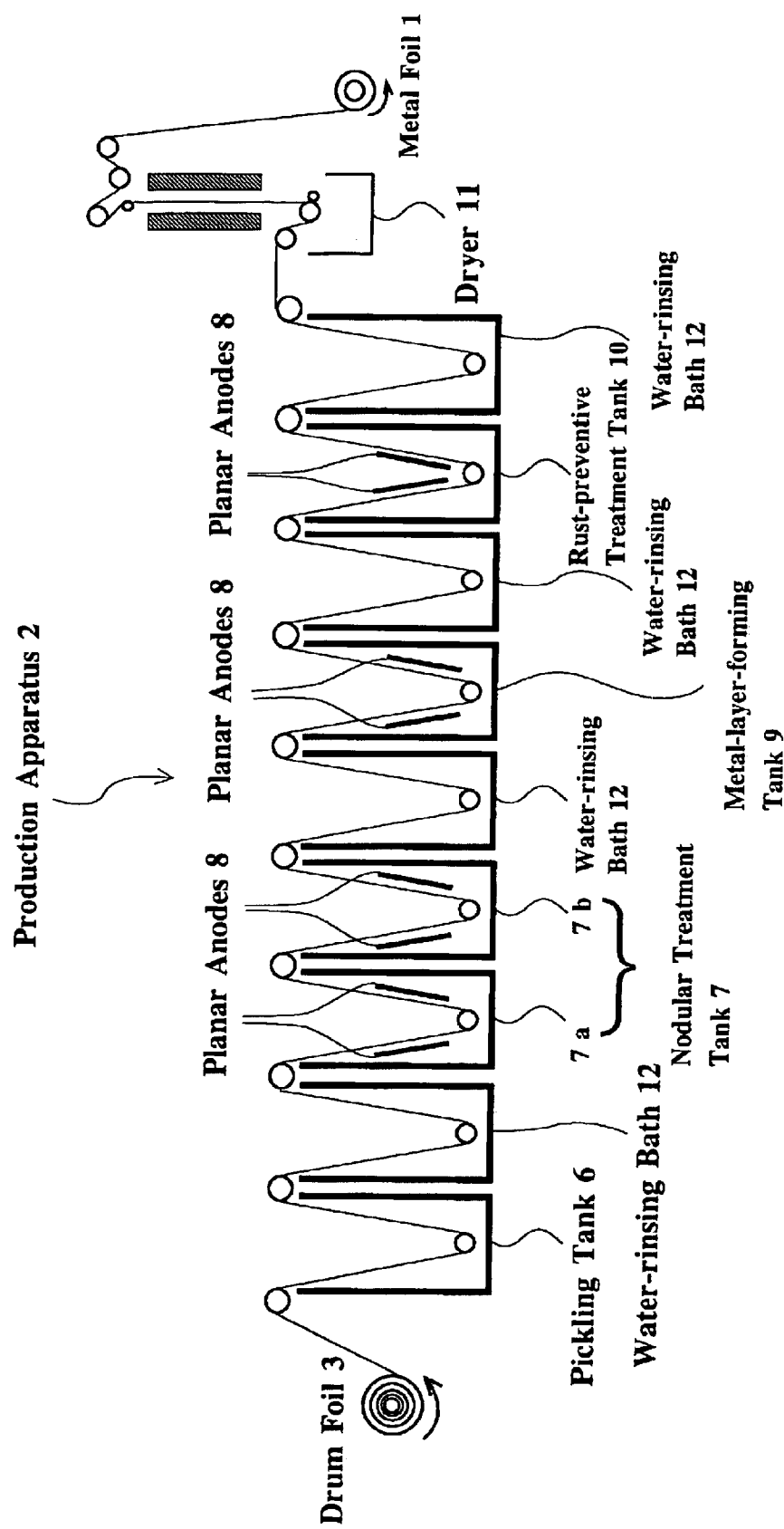
FIG. 2 is a schematic view of a process lay-out for producing copper foil for a printed wiring board according to this invention.

As shown as a schematic view of a production apparatus in FIG. 2, it is generally preferable in terms of productivity that the copper foil for a printed wiring board according to this invention is produced using the same type of apparatus as a surface treatment apparatus for surface-treated copper foil. Accordingly, the copper foil for a printed wiring board claimed in claim 1 is obtained by: first arranging a roll of copper foil having been subjected to no surface treatment in the unwinding position of a surface treatment apparatus; subjecting the copper foil surface to nodular treatment and forming a metal layer on the same while allowing the copper foil to run in a winding manner through the apparatus, and finally winding up the copper foil after drying.

In other words, the inventors of this invention use a apparatus which unwinds a roll of copper foil having been subjected to no surface treatment from one side and passes through an pickling tank, a nodular treatment tank in which copper microparticles are formed on the surface of the copper foil, a metal-layer-forming tank and a dryer zone all of which are arranged in sequence with rinsing baths properly arranged between them.

In the pickling tank, a step of what is called acid rinse is carried out so as to perform degreasing treatment, that is, completely remove fat components attached to the copper foil and to remove a surface oxide film. The pickling tank is intended to clean the copper foil and ensure uniform electrodeposition in the subsequent steps by passing the copper foil therethrough. In this acid rinse treatment, various solutions such as hydrochloric acid solution, sulfuric acid solution, sulfuric acid—hydrogen peroxide solution can be used, and the solutions used need not be limited to any particular ones. Further, the concentration and temperature of the solutions can be adjusted according to the characteristics of the production line.

The copper foil having been subjected to the acid rinse treatment then enters the nodular treatment tank in which a step of forming copper microparticles on the surface of the copper foil layer is carried out. The treatment carried out in the nodular treatment tank consists of two steps: a step of depositing copper microparticles on the copper foil layer and a step of seal plating the copper foil layer to prevent the copper microparticles from falling. As electrolysis conditions under which the step of depositing copper microparticles on the copper foil layer is carried out, the burn plating conditions are adopted. Accordingly, the concentration of the solution used in this step is made low so as to be the burn plating conditions. The burn plating conditions are not limited to any particular ones, but are determined taking into consideration the design of the production line. When using copper sulfate solution, for example, the conditions are that the concentration of copper is 5 to 20 g/l, the concentration of sulfuric acid is 50 to 200 g/l, additives (α-naphthoquinorine, dextrin, glue, thiourea, etc.) are added according to need, the temperature of the solution is 15 to 40° C., and the current density is 10 to 50 A/dm$^2$.

The step of seal plating for preventing the copper microparticles from falling is a step of level depositing copper on the copper foil layer in such a manner as to coat the copper microparticles under level plating conditions so as to prevent the copper microparticles deposited from falling. The level plating conditions are not limited to any particular ones, but are determined taking into consideration the design of the production line. When using copper sulfate solution, for example, the conditions are that the concentration of copper is 50 to 80 g/l, the concentration of sulfuric acid is 50 to 150 g/l, the temperature of the solution is 40 to 50° C., and the current density is 10 to 50 A/dm$^2$.

In the metal-layer-forming tank, a nickel layer or a tin layer is formed on the copper foil surface having been subjected to the nodular treatment. When forming a nickel layer, solutions used as a nickel electroplating solution can be used widely. For example, a nickel layer is formed (1) using nickel sulfate under the conditions that the concentration of nickel is 5 to 30 g/l, the temperature of the solution is 20 to 50° C., pH is 2 to 4, and the current density is 0.3 to 10 A/dm$^2$, (2) using nickel sulfate under the conditions that the concentration of nickel is 5 to 30 g/l, the concentration of potassium pyrophosphate is 50 to 500 g/l, the temperature of the solution is 20 to 50° C., pH is 8 to 11, and the current density is 0.3 to 10 A/dm$^2$, (3) using nickel sulfate under the conditions that the concentration of nickel is 10 to 70 g/l, the concentration of boric acid is 20 to 60 g/l, the temperature of the solution is 20 to 50° C., pH is 2 to 4, and the current density is 1 to 50 A/dm$^2$, and under the other conditions of a popular Watts bath.

When electroless nickel plating is employed, typically a nickel layer is formed using a bath, which is prepared by properly mixing nickel sulfate, sodium hypophosphite, lactic acid and propionic acid, with a stabilizer containing lead added thereto under the conditions that pH is 4.0 to 5.0 and the temperature of the solution is 85 to 95° C.

When forming a tin layer, solutions used as a tin plating solution can be used. For example, a tin layer is formed (1) using stannous sulfate under the conditions that the concentration of tin is 5 to 30 g/l, the temperature of the solution is 20 to 50° C., pH is 2 to 4, and the current density is 0.3 to 10 A/dm$^2$, (2) using stannous sulfate under the conditions that the concentration of tin is 20 to 40 g/l, the concentration of sulfuric acid is 70 to 150 g/l, the temperature of the solution is 20 to 35° C., cresolsulfonic acid is 70 to 120 g/l, gelatin is 1 to 5 g/l, β-naphthol is 0.5 to 2 g/l, and the current density is 0.3 to 3 A/dm$^2$.

After completing the formation of a metal layer, the copper foil is passed through a dryer and wound up into a roll as finished copper foil for a printed wiring board. Between the respective tanks in the surface treatment apparatus described above, water-rinsing baths are provided so that the solution used in the pretreatment steps is not brought into the tanks for the subsequent step.

Although both nickel and tin in themselves exhibit extremely high rust-preventive ability, a rust-preventive step for preventing the metal layer surface from being oxidized and corroded may be provided so that no trouble is caused during the production process of a metal clad laminate and a printed wiring board after forming the metal layer. As a method used in the rust-preventive treatment, either one of the organic rust preventive using benzotriazole, imidazole, etc. and the inorganic rust preventive using zinc, chromate, zinc alloys, etc. may be adopted. Rust preventive can be selected which is suitable for the purpose of using copper foil.

Figure 3:
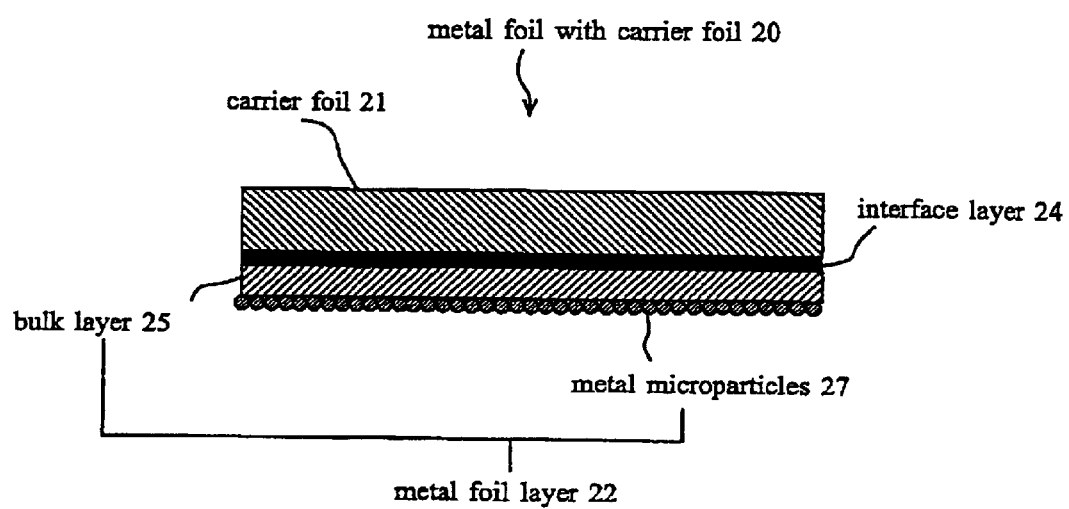
FIG. 3 is a schematic cross-sectional view of metal foil with carrier foil for a printed wiring board according to this invention.

Then the metal foil with carrier foil according to this invention will be described. The metal foil with carrier foil according to this invention is metal foil with carrier foil for a printed wiring board including three layers: a carrier foil layer, an interface layer and a metal foil layer, the metal foil with carrier foil being characterized in that the metal foil layer has a nickel or tin bulk layer 1 to 3 μm thick formed thereon, the bulk layer having metal microparticles, which are formed of the same kind of element as that used for forming the bulk layer, formed thereon. A schematic cross-sectional view showing the layer construction of the metal foil with carrier foil is shown in FIG. 3.

A first characteristic of the metal foil with carrier foil for a printed wiring board according to this invention is that it includes an interface provided on the carrier foil, a nickel or tin bulk layer provided on the interface, and metal microparticles, which are formed of the same kind of element as that used for forming the bulk layer, formed on the bulk layer. The idea that among the methods, such as electrolytic method as a wet method and evaporation method as a dry method, which can be adopted to form the nickel or tin bulk layer, the electrolytic method is advantageously used taking into consideration the control of the thickness of the film formed and the reason that a nickel or tin layer is selected as the metal foil layer are just the same as in the case of the copper foil for a printed wiring board according to this invention.

A second characteristic of the metal foil with carrier foil for a printed wiring board according to this invention is that the thickness of the nickel or tin bulk layer is 1 to 3 μm. The reason the range of the bulk layer thickness is defined as above is also the same as in the case of the copper foil for a printed wiring board according to this invention.

A third characteristic of the metal foil with carrier foil for a printed wiring board according to this invention is that an interface layer is provided between a carrier foil layer and a metal foil layer. This interface layer may be a metal interface layer which is formed using a metal, such as zinc, or an organic interface layer which is formed using an organic agent. The types of metal foil with carrier foil are divided into two: etchable and peelable, according to the process for forming the interface layer.

In the etchable metal foil with carrier foil, first it is laminated on a base resin material, and then its carrier foil is removed by etching, leaving its metal foil layer alone on the base material; on the other hand, in the peelable metal foil with carrier foil, first it is laminated on a base resin material, and then its carrier foil is removed by peeling, leaving its metal foil layer alone on the base material. Accordingly, either of the above two types of foil can be used in this invention.

In the etchable foil, however, it requires an etching apparatus for etching the carrier foil, which may increase the investment in equipment and up the cost of product. On the other hand, in the peelable foil, the carrier foil can be peeled without such an apparatus as the etchable foil requires, which may cut an extra investment in equipment. Thus the peelable foil offers the advantage over the etchable foil that it can provide less expensive products. Accordingly, a metal foil with carrier foil claimed in claim 3 is a peelable metal foil with carrier foil claimed in claim 2 in which electrolytic copper foil is used for the carrier foil layer and an organic interface layer formed using an organic agent is provided between the carrier foil layer and the metal foil layer.

The reason for selecting the organic interface layer formed with an organic agent is that forming an interface layer with a certain organic agent allows the carrier foil and the metal foil layer to be easily separated from each other in the interface. The organic interface is formed with an organic agent consisting of one or more than one selected from the group consisting of nitrogen-containing organic compounds, sulfur-containing organic compounds and carboxylic acids, as claimed in the claims. The use of these organic agents enables achieving the object of making easier the separation of the carrier foil and the metal foil layer from each other.

Of the nitrogen-containing organic compounds, sulfur-containing organic compounds and carboxylic acids herein mentioned, the nitrogen-containing organic compounds include nitrogen-containing substituents. As a nitrogen organic compound, in particular triazole compounds having substituents, such as 1,2,3-benzotriazole (hereinafter referred to as "BTA"), carboxybenzotriazole (hereinafter referred to as "CBTA"), N',N'-bis(benzotriazolyl methyl) urea (hereinafter referred to as "BTD-U"), 1H-1,2,4-triazole (hereinafter referred to as "TA") and 3-amino-1H-1,2,4-triazole (hereinafter referred to as "ATA") are preferably used.

As a sulfur organic compound, mercaptobenzothiazole (hereinafter referred to as "MBT"), thiocyanuric acid (hereinafter referred to as "TCA"), 2-benzimidazolethiole (hereinafter referred to as "BIT"), etc. are preferably used.

As carboxylic acids, monocarboxylic acids are particularly preferably used, among them, oleic acid, linoleic acid and linolenic acid are preferably used.

Then the use of the above-mentioned organic agents will be described while describing the process for forming an interface layer on the carrier foil. The formation of an interface layer on the carrier foil can be performed in the steps of: dissolving the above-mentioned organic agent in a solution; and dipping the carrier foil into the solution or showering, spraying, dropping or electrodepositing the solution on the carrier foil surface on which the interface layer is intended to be formed. The process adopted need not be limited to any specific ones. The concentration of the organic agent in the solution, in this case, is preferably 0.01 g/l to 10 g/l for all the above-mentioned organic agents and the temperature of the solution is preferably in the range of 20 to 60° C. The concentration of the organic agent is not particularly limited and basically it does not matter whether it is high or not.

The formation of an interface layer can also be performed using more than one organic agent described above in combination, and moreover, the above-described process for forming an interface layer can be performed repeatedly. This makes it possible to control the thickness of the interface layer to higher accuracy.

The formation of an interface layer may be due to the adsorption of the organic agent on the carrier foil surface. Accordingly, it can be considered that the higher the concentration of the organic agent is, the more quickly the organic agent is adsorbed on the carrier foil surface; however, the concentration of the organic agent is determined basically according to the speed of the production line. The duration that the carrier foil is brought into contact with the organic agent dissolved in a solution is also determined according to the speed of the production line, and from the practical point of view, it should be determined using the contact duration of 5 to 60 seconds as a standard.

Taking into consideration the above-described things, if the concentration of the organic agent is lower than 0.01 g/l, which is the lower limit, it becomes difficult for the organic agent to be adsorbed on the carrier foil surface for a short period time, in addition, a variation is created in the thickness of the interface layer formed, which makes it impossible to stabilize the product quality. On the other hand, even if the concentration of the organic agent is higher than 10 g/l, which is the upper limit, the adsorption rate of the organic agent on the carrier foil surface does not increase with co-relation in its amount added, which is not preferable in terms of production costs.

The use of the above-mentioned organic agents makes easier the amount control of organic during the formation of an interface layer and allows the release strength between the carrier foil and the metal foil to fall within a certain range. Furthermore, since the above-mentioned organic agents are excellent in thermal stability, even after they are heat-treated, the stability in release strength can be ensured.

Generally and basically these organic agents are not conductive materials, but materials having insulating properties. The metal foil with carrier foil according to this invention, however, is such that it is polarized with its carrier foil in itself being a cathode and thereby allows a metal to be electrodeposited directly on the organic interface layer formed on the carrier foil using an organic agent; therefore, it needs to be in state where an electric current is allowed to pass through the organic interface layer. In other words, there are naturally limits to the thickness of the interface layer formed of an organic agent, and its thickness should be set at a value which will ensure the proper release strength and allow the stable electrodeposition of a metal.

Thus, it is neither the concentration of an organic agent in a solution nor the treatment duration, but the thickness of the organic interface layer formed, in other words, the amount of the organic agent existing on the interface layer that is important when forming an interface layer. The inventors of this invention have confirmed that the preferable thickness of the interface layer formed using an organic agent is in the range of 1 nm to 1 µm.

The thickness of the interface layer in the range herein defined allows proper release strength to be ensured and a metal to be stably electrodeposited. Specifically, if the amount (thickness) of the organic agent used for forming the organic interface layer is lower than 1 nm, which is the lower limit, a variation is created in the thickness of the interface layer formed of the organic agent, which makes impossible the formation of a uniform interface layer. As a result, stable and proper release strength cannot be obtained and, in some cases, the carrier foil cannot be peeled off.

On the other hand, if the amount (thickness) of the organic agent used for forming the organic interface layer is higher than 1 µm, which is the upper limit, the state in which an electric current passes through the interface layer becomes unstable, and hence the electrodeposition of a metal becomes unstable, whereby it becomes difficult to form an electrolytic copper foil layer having a uniform thickness. Furthermore, even if a longer time is spent depositing a metal, the release strength obtained does not satisfy the value required as a minimum. And if the thickness of the interface layer is allowed to be larger, the interface layer is brought to a state in which no current passes through it.

The term "proper release strength" herein used means the strength in the range of 1 to 200 gf/cm obtained by the measurement in accordance with JIS-C-6481. This range is set based on the release strength in the interface of carrier foil and electrolytic copper foil which is considered to be proper from the inventors' experience plus the ideal strength required by the users of the copper foil with carrier foil, taking into consideration the performance of the peelable electrolytic metal foil carrier foil of the prior art. The lower the release strength in the interface of carrier foil and metal foil becomes, the easier the peeling operation becomes. However, if the release strength is lower than 1 gf/cm, the carrier foil and the metal foil are partially separated from each other by themselves when winding up the metal foil with carrier foil or coating the metal foil during the production process and blister occurs at the separated portion, which in turn causes defects such as misalignment. On the other hand, if the release strength is higher than 200 gf/cm, it is far from the image of this invention which is characterized in that the carrier foil can be easily peeled off, and in the peeling of the carrier foil, certain means, for example, a special peeling apparatus needs to be used.

Figure 4:
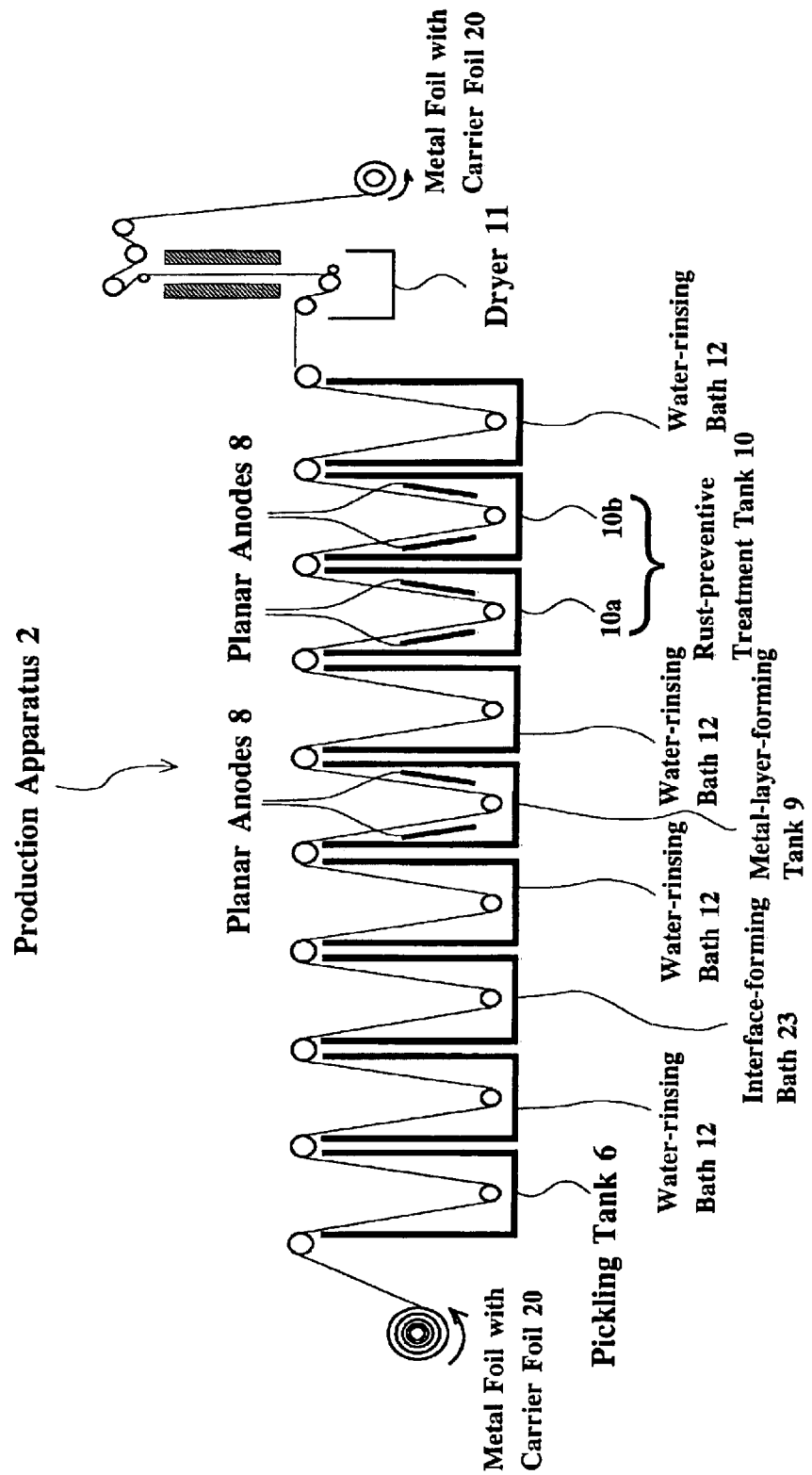
FIG. 4 is a schematic view of a process lay-out for producing metal foil with carrier foil for a printed wiring board according to this invention.

As shown as a schematic cross-sectional view of a production apparatus in FIG. 4, it is generally preferable in terms of productivity that the metal foil with carrier foil for a printed wiring board according to this invention is produced using the same type of unit as a surface treatment apparatus for surface-treating copper foil, just like the case where the copper foil according to this invention is produced. Accordingly, the metal foil with carrier foil for a printed wiring board is obtained by: first arranging a roll of carrier foil having been subjected to no surface treatment in the unwinding position of a surface treatment apparatus; subjecting the carrier foil surface to interface forming treatment, formation of a bulk layer, and nodular treatment in this order while allowing the carrier foil to run in a winding manner through the apparatus, and finally winding up the carrier foil after drying.

Thus, the inventors of this invention adopt a production process in which an organic interface layer and a metal foil layer are successively formed on carrier foil in the steps of unwinding a roll of carrier foil from one side of the unit; and passing the same through an pickling tank, an interface forming bath using an organic agent, a bulk-layer-forming tank for providing a nickel or tin layer, a nodular treatment tank for forming metal microparticles on the surface of the bulk layer, and a dryer all of which are successively arranged with rinsing baths properly arranged between them. The process will be described below according to the order of the respective steps.

In the pickling tank, a step of what is called acid rinse is carried out. Its conditions and object are the same as those of the acid rinse treatment in the production of the copper foil for a printed wiring board according to this invention; therefore, the detailed description will be omitted to avoid the repetition.

In the organic interface forming bath, a step of treating one side or both sides of the carrier foil to form an interface layer thereon is carried out using the organic agent claimed in claim 4. The process for forming this interface layer is just as described above.

After forming the organic interface layer, a nickel or tin bulk layer is subsequently formed on the interface layer. The solution and the electrolytic conditions adopted in this step are the same as those of the metal foil layer forming treatment in the production of the copper foil for a printed wiring board as claimed in claim 1; therefore, the description will be omitted to avoid the repetition. In this bulk layer forming step, a metal component, which is to form a bulk layer, is electrodeposited uniformly and even on the surface of the organic interface layer by: dipping the carrier foil having the organic interface layer formed thereon in the solution; and arranging an anode parallel to the surface of the carrier foil having the organic interface layer formed thereon, so as to cathode-polarize the carrier foil itself. Hereinafter, in the tanks in which an electrolytic method is applied, an anode will be arranged in the same manner as above.

After completing the formation of the nickel or tin bulk layer, the carrier foil enters the nodular treatment tank in which a step of forming metal microparticles on the surface of the bulk layer is carried out. The step carried out in the nodular treatment tank consists of two sub-steps: a sub-step of depositing metal microparticles on the bulk layer; and a sub-step of seal plating for preventing the metal microparticles from falling.

In the step of depositing metal microparticles on the bulk layer, the same solution as that used in the above bulk-layer-forming tank is used as a supply source of metal ion; specifically, when the bulk layer is formed of nickel, nickel microparticles are formed on the bulk layer, and when the bulk layer is formed of tin, tin microparticles are formed on the same. However, in the bulk-layer-forming tank the level plating conditions are adopted as the electrolysis conditions, whereas in the nodular treatment tank the burn plating conditions are adopted. Accordingly, the concentration of the solution used in the step of depositing metal microparticles on the bulk layer is generally made low compared with the concentration of the solution used in the bulk-copper-forming bath so as to make easier the preparation of the burn plating conditions. The burn plating conditions are not limited to any particular ones, but are determined taking into consideration the characteristics of the production line.

The conditions under which nickel microparticles are formed include, for example, the use of a solution of a mixture consisting mainly of a nickel salt, an ammonium salt and a non-ionic macromolecular activator having polyoxyethylene group as a hydrophilic group. The electrolysis conditions in this case are that the temperature of the solution is room temperature, pH is 5 to 7 and the current density is 2.5 to 5.0 A/dm$^2$. The most stable uniform electrodeposition performance can be obtained in the pH range of 5 to 7. The pH value is adjusted using ammonium hydroxide.

As a nickel salt, preferably nickel chloride or nickel sulfate is used in such a manner as to give a nickel concentration of 0.3 g/l or higher. If the nickel concentration is lower than 0.3 g/l, the nickel microparticle forming rate becomes low, which makes it difficult to form nickel microparticles uniformly. As for the upper limit of the nickel concentration, it can be increased until the solution is saturated.

As an ammonium salt, preferably any one of ammonium chloride, ammonium sulfate and ammonium acetate is used in such a manner as to give an ammonium ion concentration of 0.8 g/l or higher. In the range of ammonium ion concentration of lower than 0.8 g/l, the particle diameter of nickel microparticles becomes ununiform. As for the upper limit of the ammonium ion concentration, it can be increased until the solution is saturated.

As a non-ionic macromolecular activator, which is added so as to prevent deposition defects from occurring, any one of polyoxyethylene alkyl ether, polyoxyethylene alkyl phenol ether, polyoxyethylenated polypropylene glycol, etc. each having polyoxyethylene group as a hydrophilic group is added within the range of 0.01 to 0.07% by weight. If the amount added is less than 0.01% by weight, the non-ionic macromolecular activator does not play a role in preventing deposition defect from occurring; but on the other hand, if the amount is increased to more than 0.07% by weight, the effect of preventing deposition defects from occurring is not improved very much. The non-ionic macromolecular activators herein mentioned are, in particular, chemicals such as polyoxyethylene oleyl ether, polyoxyethylene lauryl ether and polyoxyethylene octyl phenol ether.

The conditions under which tin microparticles are formed include, for example, the use of solutions used as a tin plating solution. The tin microparticles are formed, for example, under the conditions of 40 to 100 g/l of stannous sulfate, sulfuric acid concentration of 60 to 150 g/l, temperature of the solution of 20 to 30° C., and current density of 8 to 10 A/dm$^2$.

In the step of seal plating for preventing the metal microparticles from falling, nickel or tin is uniformly deposited on the microparticles under the level plating conditions in such a manner as to coat the metal microparticles so as to prevent the same from falling. Accordingly, the same solution as that used in the above bulk-layer-forming tank can be used as a supply source of metal ion, in addition, the same electrolysis conditions except for plating time can also be adopted. The plating time in the range of 3 to 8 seconds makes it possible to effectively prevent the metal microparticles from falling.

In this stage, if necessary, the metal foil with carrier foil may be subjected to rust-preventive treatment. As means used in this rust-preventive treatment, any one of the organic rust preventive, which uses benzotriazole, imidazole, etc. and the inorganic rust preventive, which uses a metal that is base compared with nickel etc. or an alloy, can be adopted. Rust preventive can be chosen depending on the purpose for which the electrolytic metal foil carrier foil is used.

After completing the above treatment, the carrier foil enters the dryer. The dryer is the section where the final step is carried out to wind up into a roll the finished metal foil with carrier foil which has passed through the tanks of the above respective steps filled with respective types of solutions. In other words, the section is such that it heat-dries the finished metal foil with carrier foil in the wet state by allowing the same to pass through its heat drying furnace.

The electrolytic metal foil carrier foil according to this invention is produced in the above-described steps. And the electrolytic metal foil carrier foil is used as the material for use in the production of printed wiring boards. The printed wiring boards herein mentioned include the concepts of all types of the layer construction, such as single sided printed wiring boards, double sided printed wiring boards and multilayer printed wiring boards including mass lamination boards of three layers or more, and moreover, they include printed wiring boards of all types of base materials, such as not only rigid printed wiring boards, but also flexible printed wiring boards including what is called special printed wiring boards of TAB, COB, etc. and hybrid printed wiring boards.

The term "carrier foil" herein used means the carrier foil having the following characteristics. According to the production process of the metal foil with carrier foil of this invention, a metal foil layer is electrodeposited on the surface of the carrier foil; therefore, the carrier foil should be electrically conductive at least on its surface. And the carrier foil plays a role in keeping the metal foil layer joined thereto, making easy the handling of the metal foil layer, and reinforcing and protecting the metal foil layer in every respect, while it passes through the successive process steps at least until a metal clad laminate is produced; therefore, the carrier foil layer should have a certain strength. Any types of carrier foil can be used as the "carrier foil" as long as it satisfies the above characteristic requirements. Generally metal foil is associated with carrier foil; however, the "carrier foil" is not limited to metal foil, but includes, for example, a conductive organic film which is an organic film plated with a conductive material.

Figure 5:
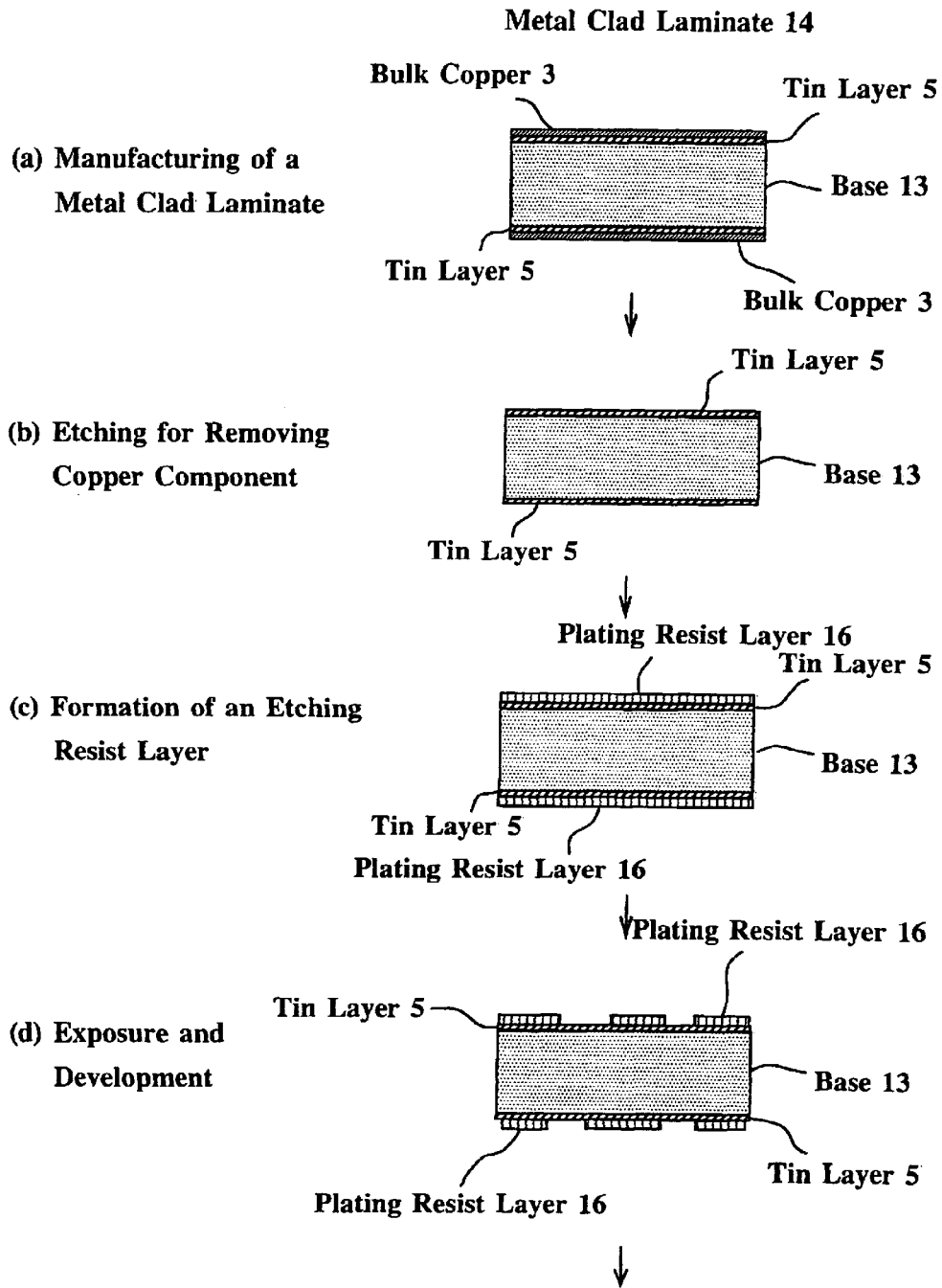
FIGS. 5 to 8 are conceptual views showing the production flow of a printed wiring board which uses copper foil for a printed wiring board or metal foil with carrier foil for a printed wiring board according to this invention.
Figure 6:
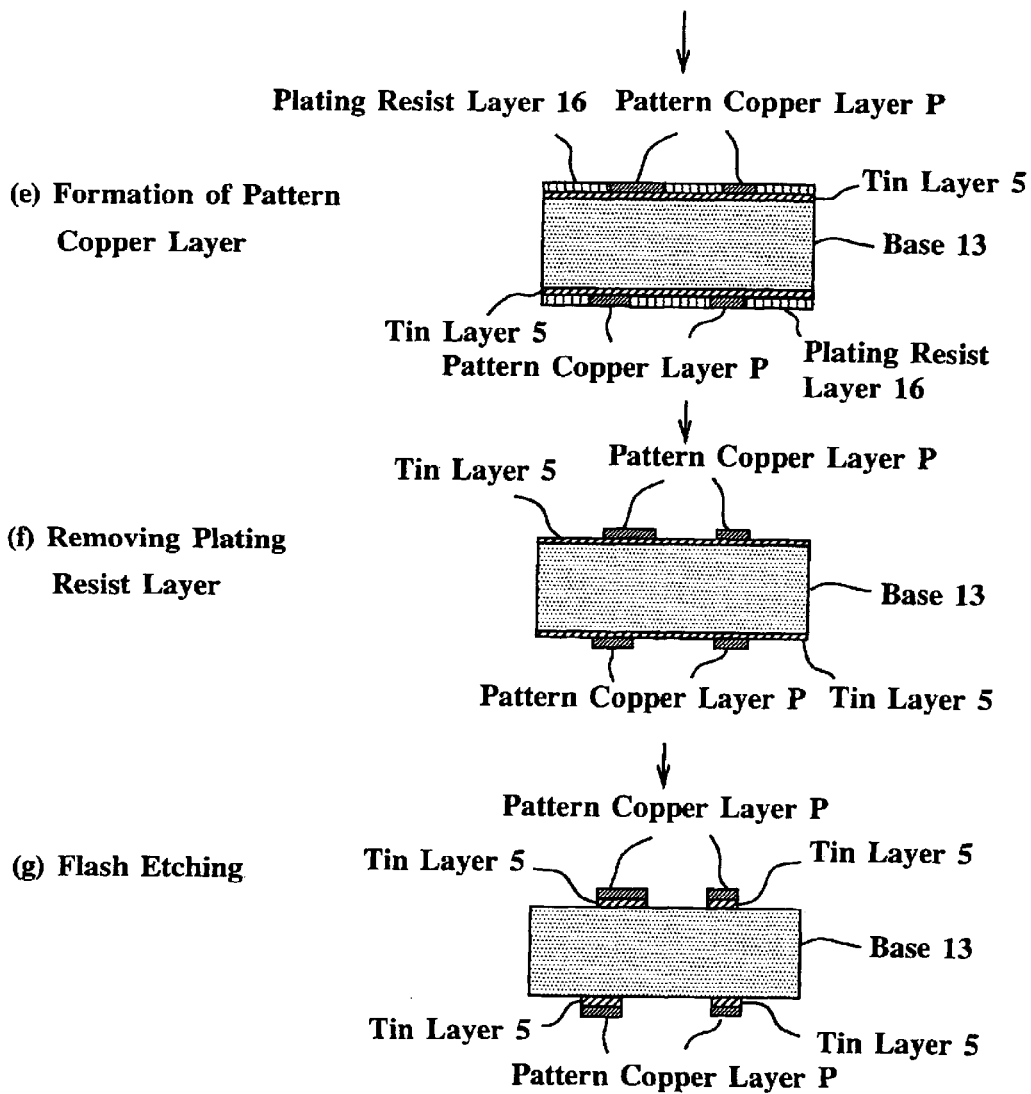

The aforementioned copper foil and metal foil with carrier foil for printed wiring boards are used in the production of printed wiring boards by a semi-additive process. For the copper foil for printed wiring boards, the following semi-additive process for producing printed wiring boards can be adopted. The process is schematically shown in FIGS. 5 and 6. In the following the process will be described with reference to FIGS. 5 and 6.

First, a metal clad laminate is produced using the copper foil according to this invention as capsheet foil. As shown in FIG. 5(a), in the metal clad laminate, a copper layer is located on the surface side thereof and a nickel or tin layer is located on the substrate side.

After removing the copper carrier of the capsheet foil by etching, the nickel or tin layer constitutes the outer layer of the metal clad laminate, as shown in FIG. 5(b). As an etchant for etching the copper foil, an alkali etchant is preferably used, because an alkali etchant can remove the copper carrier alone while allowing the nickel or tin layer to remain unattacked. The alkali etchants applicable include, for example, etchants prepared using ammonium hydroxide, ammonium chloride and copper cloride.

Then a plating resist layer is formed on the nickel or tin layer. For the formation of the plating resist layer, any one of photosensitive dry film, liquid photoresist, etc. can be arbitrarily selected and used. However, taking into consideration the subsequent pattern plating, one prepared with materials which have excellent chemical resistance and make the control of the plating resist thickness easy should be selected and used. The metal clad laminate with a plating resist layer formed thereon is shown in FIG. 5(c).

Then the plating resist layer formed is subjected to circuit forming pattern exposure and development, so as to remove the plating resist layer of the circuit formed portion alone while leaving the plating resist layer of the circuit unformed portion alone, as shown in FIG. 5(d). The conditions under which exposure and development are carried out are not limited to any specific ones, and the specification suitable for the production line can be selected considering the accuracy of the circuit to be formed, the characteristics of the plating resist layer, etc.

On the circuit formed portion of the metal clad laminate having been subjected to development, a pattern copper plating layer is formed. FIG. 6(e) shows the metal clad laminate having been subjected to pattern copper plating, and hence having copper deposited thereon. The formation of this pattern copper plating layer may be carried out by any one of electrolytic plating and electroless plating. And the solutions used in the electrolysis and the conditions under which the electrolysis is carried out are not limited to any specific ones. They can be selected taking into consideration their compatibility with the plating resist. In the copper layer thus formed, its cross section has an extremely good aspect ratio.

After completing the formation of the copper layer on the circuit formed portion, the plating resist layer of the circuit unformed portion is removed. Generally, the plating resist layer is swelled and removed using an alkaline solution. After removing the plating resist layer on the circuit unformed portion, the nickel or tin layer alone remains on the surface of the substrate, as seen from the cross section of the metal clad laminate after removing the plating resist layer shown in FIG. 6(f).

Then, in the final step, the nickel or tin layer on the circuit unformed portion alone is removed by the flash etching process using a selective etchant which allows the copper layer to remain undissolved. FIG. 6(g) shows a cross section of the circuit after the flash etching. Since the copper layer is allowed to remain unattacked by the selective etchant, the circuit configuration formed by the above pattern copper plating layer formation can be maintained as it is; as a result, a circuit can be formed of which cross section has an excellent aspect ratio.

For the selective etching of a tin layer, commercially available solutions known as solder stripping agent can be used. Even if no commercially available solder stripping agent is used, the tin layer can be etched selectively and easily by using an aqueous solution of sodium hydroxide 110 to 130 g/l in concentration and by anode-polarizing the metal clad laminate using iron or an iron based alloy as a cathode.

For the selective etching of a nickel layer, any one of (1) a solution of sulfuric acid 550 ml/l to 650 ml/l in concentration, (2) a solution of mixed acid of sulfuric acid and nitric acid and (3) a mixed solution of sulfuric acid and m-nitrobenzensulfonic acid can be used. For the first solution, a solution of sulfuric acid 580 to 620 ml/l in concentration is preferably used, and the nickel layer is dissolved electrolytically by cathode-polarizing the metal clad laminate in the solution. The reason the concentration of the sulfuric acid is set at 550 ml/l to 650 ml/l is that if the concentration is lower than 550 ml/l, the dissolving speed becomes low, which is not suitable for the practical operation. On the other hand, even if the concentration is higher than 650 ml/l, the dissolving rate does not increase, and moreover, the dissolving reactivity to nickel decreases. And in the concentration range of 580 to 620 ml/l which is considered to be more preferable, the solution provides most excellent peeling rate and its quality becomes most stable.

Figure 7:
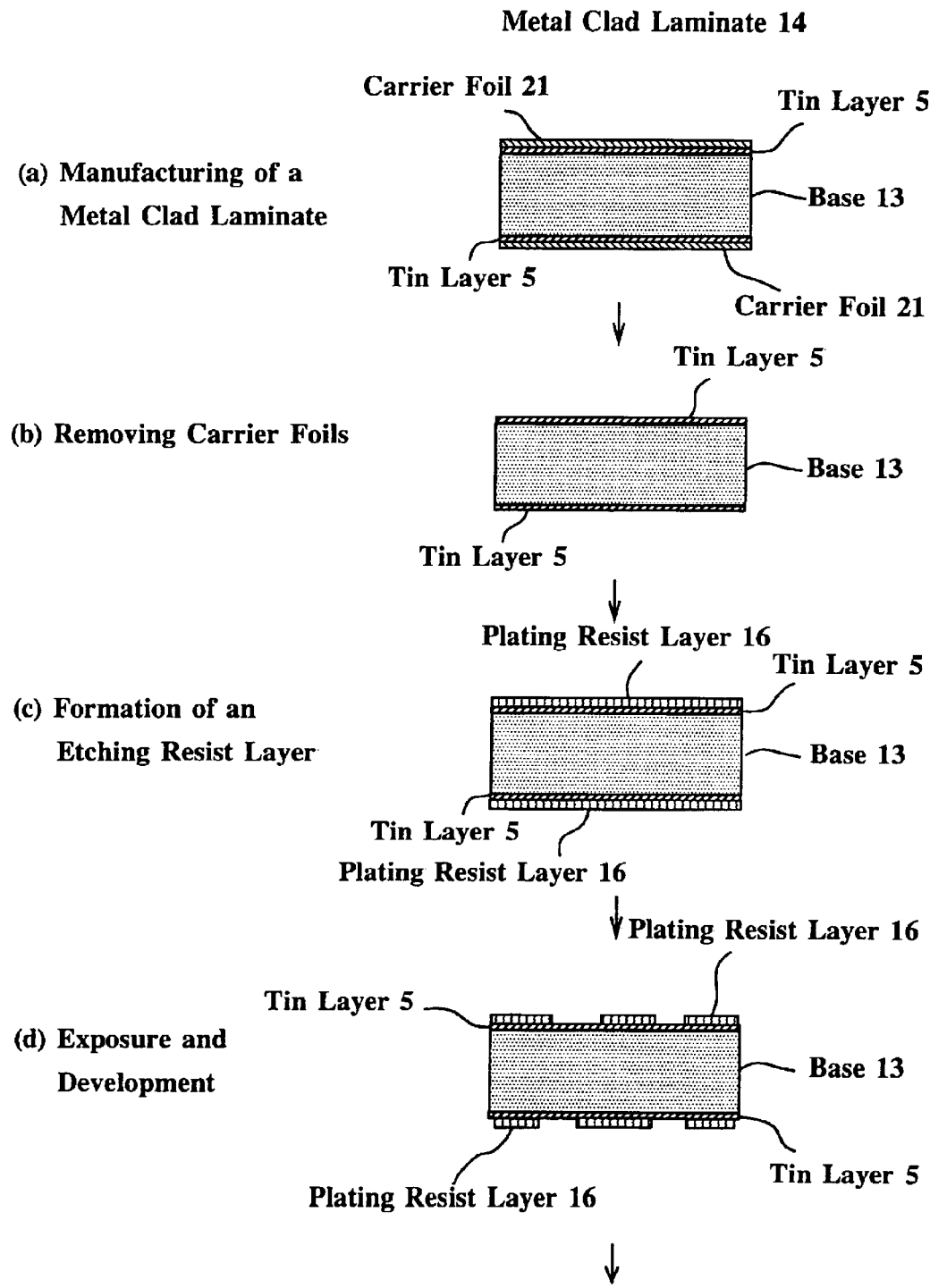

The production of a printed wiring board by the semi-additive process using metal foil with carrier foil is as described below. In the following the production process will be described with reference to FIGS. 7 and 8. First, a metal clad laminate is produced using metal foil with carrier foil according to this invention in such a manner as for the metal foil with carrier foil to form the external layer of the metal clad laminate to be produced. In this step, as shown in FIG. 7(a), the carrier foil exists as the external layer of the metal clad laminate and serves to protect the metal foil layer of nickel or tin, which is located between the carrier foil and the substrate, from contamination and damage.

Figure 8:
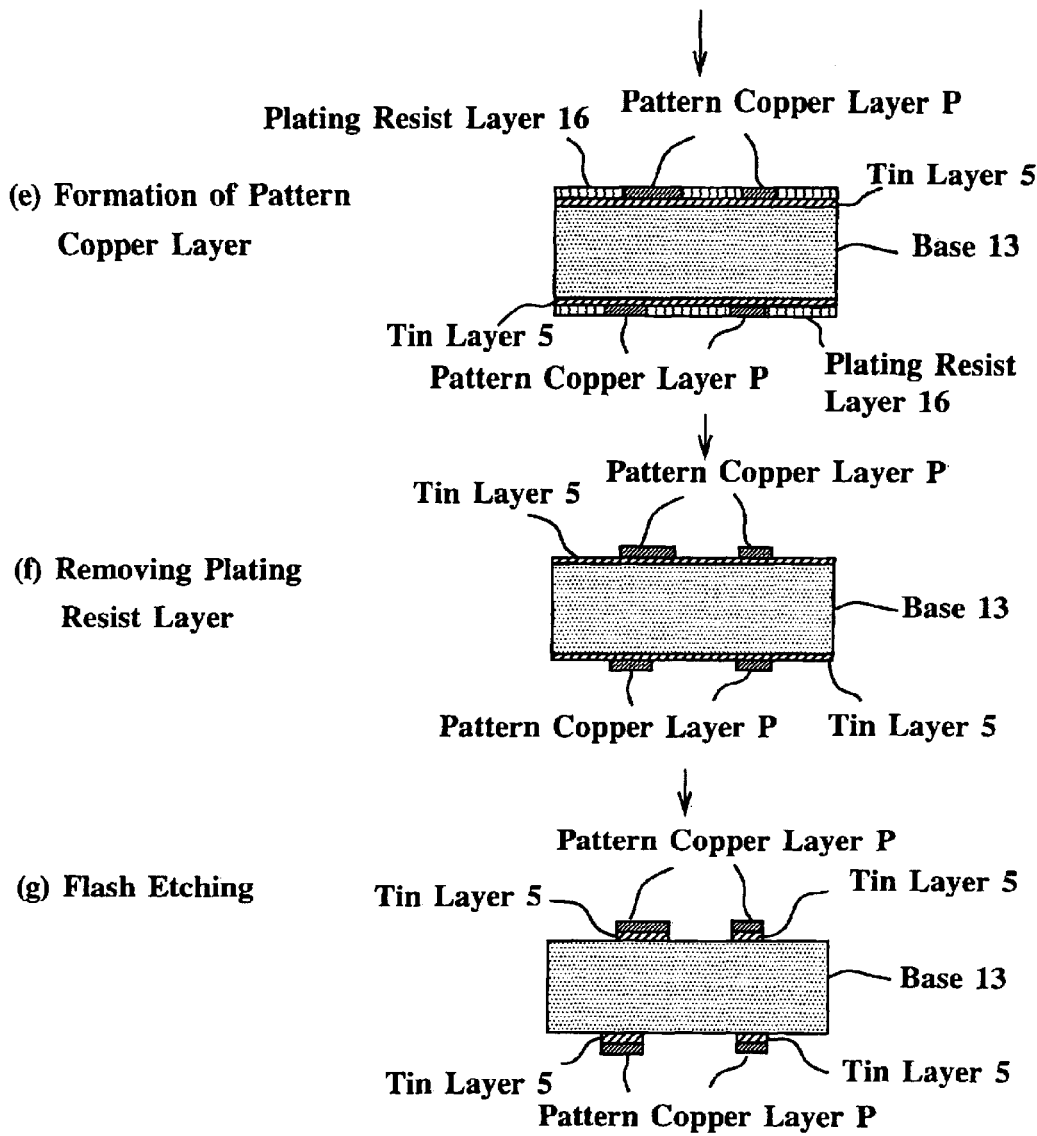
Figure 9:
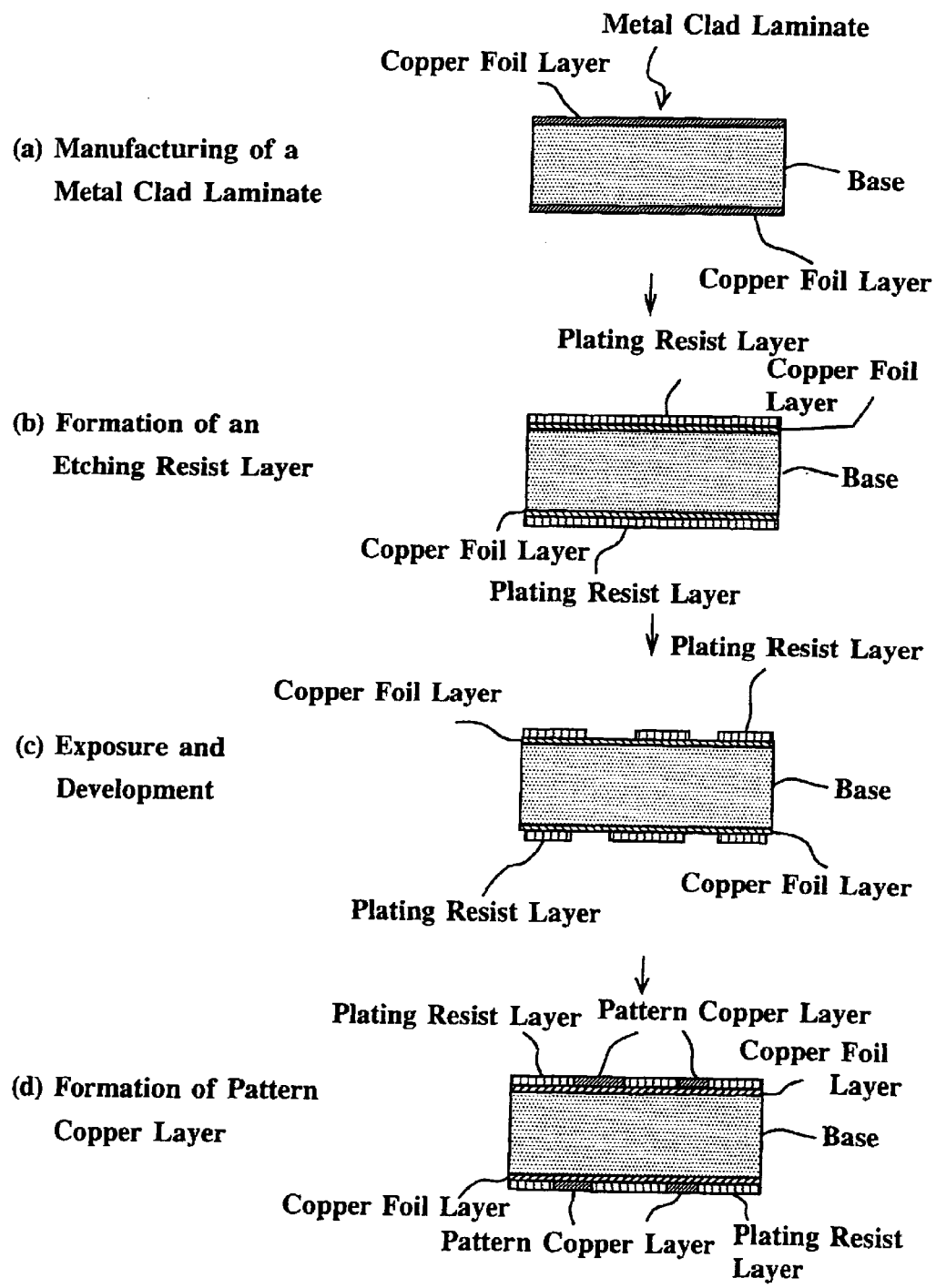
FIGS. 9 and 10 are conceptual views showing the production flow of a printed wiring board according to the prior art.
Figure 10:
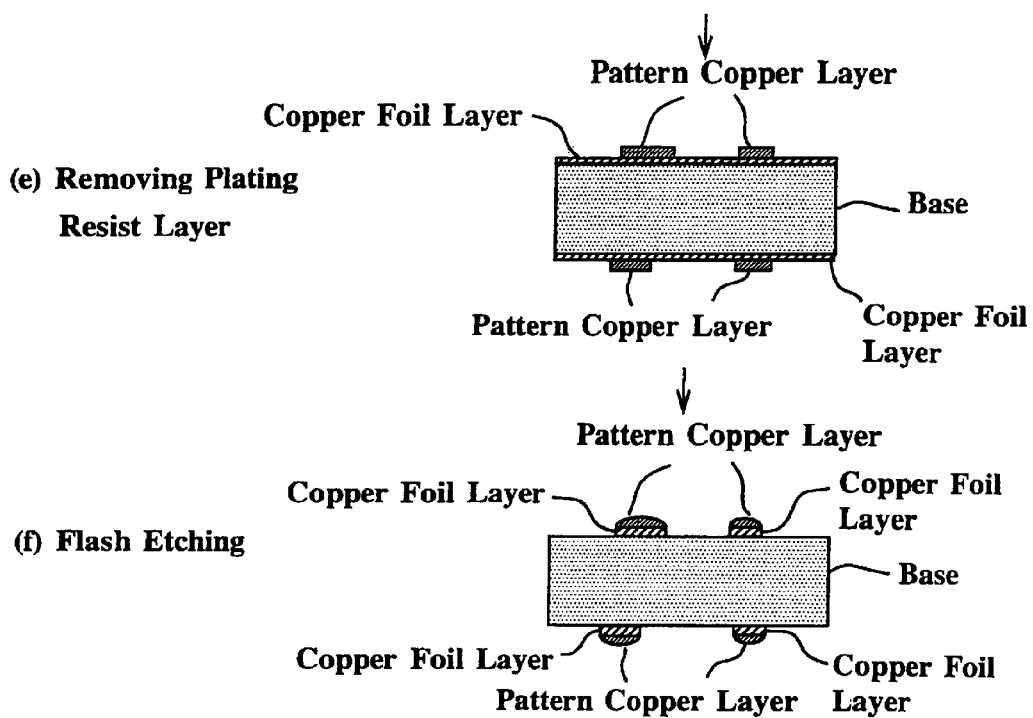

Accordingly, in the next step, the carrier foil is removed from the metal foil layer of nickel or tin. If the carrier foil is etchable foil typified by, for example, aluminum carrier foil, it is removed by etching. On the other hand, if the carrier foil is peelable foil, it is removed by peeling. The aforementioned metal foil with carrier foil having an organic interface formed on its carrier foil corresponds to the latter foil. The production process of the printed wiring board after removing the carrier foil is schematically shown in FIGS. 7(b) to 8. After removing the carrier foil, the metal foil layer of nickel or tin is located on the external layer of the metal clad laminate.

The subsequent steps, starting with the formation of a plating resist layer on the metal foil layer and ending with the flash etching, are the same as those of the process for producing a printed wiring board using the aforementioned metal foil for printed wiring boards; accordingly, the description will be omitted to avoid the repetition.

DETAILED DESCRIPTION OF THE PREFERRED EMBODIMENTS

In the following, the processes for producing copper foil and metal foil with carrier foil for a printed wiring board according to this invention will be described, and several embodiments of the production of a printed wiring board by the semi-additive process using the above types of foil will also be described.

EXAMPLE 1

In this embodiment, the production of metal foil 1 for printed wiring boards according to this invention will be described, and a test substrate of 80 μm pitch (circuit width 40 μm, line to line gap 40 μm) produced using the metal foil 1 will also be described. A production apparatus 2 used is a type shown in FIG. 2 in which unwound drum foil (electrolytic copper foil having been subjected to no surface treatment) 3 runs in a winding manner through the tanks in which the respective process steps are carried out. The metal foil 1 of this embodiment was produced by using drum foil 3, 18 μm thick classified as grade 3 and forming a nickel layer 5, 2 μm thick on the matte side (one side of the electrolytic copper foil deposited on a cathode which is opposite to the side in contact with the cathode) of the drum foil 3. In the following, the production conditions will be described according to the order of the respective process steps for which different types of tanks are arranged in series successively.

The unwound drum foil 3 first enters an pickling tank 6. The pickling tank 6 was filled with dilute sulfuric acid solution 150 g/l in concentration and 30° C. in temperature, in which the drum foil 3 was dipped for 30 seconds and the fat components attached thereto as well as the surface oxide film formed thereon were removed.

The drum foil 3 coming out of the pickling tank 6 then enters a nodular treatment tank 7 in which the step of forming copper microparticles 4 on the matte side surface thereof is carried out. The step of the nodular treatment conducted in the nodular treatment tank 7 consists of: a sub-step 7A of depositing copper microparticles 4 on the drum foil 3; and a sub-step 7B of seal plating the drum foil 3 so as to prevent the copper microparticles 4 from falling.

In the sub-step 7A of depositing copper microparticles 4 on the drum foil 3, electrolysis was carried out for 10 seconds in a copper sulfate solution containing 100 g/l of sulfuric acid and 18 g/l of copper, of which temperature was 25° C., under the burn plating condition that the current density was 10 A/dm$^2$. In this case, planar anodes 8 were arranged parallel to the surface of the drum foil 3, as shown in FIG. 2.

In the sub-step 7B of seal-plating the drum foil 3 so as to prevent the copper microparticles 4 from falling, electrolysis was carried out for 20 seconds in a copper sulfate solution containing 150 g/l of sulfuric acid and 65 g/l of copper, of which temperature was 45° C., under the level plating condition that the current density was 15 A/dm$^2$. In this case, planar anodes 8 were arranged parallel to the surface of the drum foil 3 on which the copper microparticles 4 had been deposited, as shown in FIG. 2. Thus the nodular treatment of the drum foil 3 is completed.

In a metal-layer-forming tank 9, a nickel layer 5 was formed. In the same tank, electrolysis was carried out in a nickel sulfate solution containing 20 g/l of nickel, of which temperature was 40° C. and pH was 3, under the condition that the current density was 10 A/dm$^2$. And the nickel layer 5, 2 μm thick was electrodeposited uniformly and even on the drum foil 3 while the drum foil 3 passed through the metal-layer-forming tank 9.

After completing the formation of the nickel layer 5, the side of the drum foil 3 opposite to the side having the nickel layer 5 formed thereon was subjected to zinc rust-preventive treatment in a rust-preventive treatment tank 10. The treatment was carried out in a zinc sulfate bath containing 70 g/l of sulfuric acid and 20 g/l of zinc, of which temperature was 40° C., under the condition that the current density was 150 A/dm$^2$. After completing the rust-preventive treatment, finally the drum foil 3 was passed through a dryer 11, which was heated to atmospheric temperature of 110° C. by an electric heater, over 40 seconds and wound up into a roll as finished metal foil 1 for a printed wiring board. Between the tanks in which the respective steps were carried out, water-rinsing baths 12 capable of water rinsing were provided, and the drum foil 3 is water-rinsed for about 15 seconds in each tank, whereby the solution used in pretreatment steps is prevented from being brought into the subsequent steps.

A metal clad laminate 14 was produced using a base 13 which was formed of this metal foil 1 for a printed wiring board and two sheets of FR-4 prepreg 150 μm thick, and a printed wiring board 15 was tentatively produced. In the following the production process will be described with reference to FIGS. 5 and 6. In the metal clad laminate 14 produced here, the copper layer corresponding to the drum foil 3 and the nickel layer 5 were laminated in such a manner as to allow them to locate on the surface side and on the base 13 side, respectively, as shown in FIG. 5(a).

Then, the copper carrier of the caplayer copper foil was removed by etching using an alkali copper etchant. In this case, etching was carried under the conditions that the copper etchant contained 6 mol/l of ammonium hydroxide, 5 mol/l of ammonium chloride and 2 mol/l of copper chloride dihydrate, and the temperature of the solution was 50° C. while spraying the etchant on the surface of the metal clad laminate by showering. After completing the etching, the metal clad laminate was water-washed and dried. In this stage, the nickel layer 5 constituted the external layer of the metal clad laminate 14, as shown in FIG. 5(b).

Then, a plating resist layer 16 is formed on the above nickel layer 5, as shown in FIG. 5(c). The formation of the plating resist layer 16 was carried out by coating the nickel layer 5 with ultraviolet light sensitive synthetic rubber based negative oily photoresist to 3 μm thick by the roller coating process. The plating resist used was in particular EPPR manufactured by Tokyo Ohka Kogyo Co., Ltd. Immediately after the plating resist layer 16 was formed, it was subjected to circuit forming pattern exposure using the aforementioned comb type pattern of 80 μm pitch, and the photosensitive dry film of the circuit unformed portion was cured.

The metal clad laminate 14 having the plating resist layer 16 formed thereon was then subjected to development. The development removed the plating resist layer 16 of the circuit formed portion alone while leaving the plating resist layer 16 of the circuit unformed portion alone, as shown in FIG. 5(d). The development was carried out by spraying the surface of the metal clad laminate having been subjected to exposure with a developer for the aforementioned EPPR. After the development, the metal clad laminate was water-washed and dried.

On the metal clad laminate 14 having been subjected to development, a pattern copper layer was formed so as to form a copper layer on the circuit formed portion, as shown in FIG. 6(e). This copper layer formation was carried out by cathode-polarizing the surface of the metal clad laminate 14 and using copper electroplating. A copper layer having the same thickness as that of the plating resist layer 16 was formed on the circuit formed portion by 90-second electrolysis in a copper sulfate solution containing 150 g/l of sulfuric acid and 65 g/l of copper, of which temperature was 45° C., under the level plating condition that the current density is 10 A/dm$^2$.

After completing the formation of the pattern copper layer, the plating resist layer 16 on the circuit unformed portion was removed. The removal of the cured plating resist layer was carried out while swelling the plating resist layer 16 by spraying the surface of the metal clad laminate 14 having been subjected to plating with EPPR stripping solution C by showering. As seen from the cross section of the metal clad laminate, from which the plating resist layer 16 had already been removed, shown in FIG. 6(f), after the plating resist layer 16 of the circuit unformed portion was removed, the nickel layer 5 alone remained on the surface of the substrate.

After completing the removal of the plating resist layer 16 on the circuit unformed portion, flash etching was carried out using a selective etchant which allows the nickel layer 5 on the circuit unformed portion alone to be dissolved and the copper layer to remain undissolved, and then the metal clad laminate was water-washed and dried. FIG. 6(g) shows the circuit cross section after selective etching. The selective etching of the nickel layer was carried out by spraying the surface of the metal clad laminate 14 with a sulfuric acid based solution, which was prepared by adding 56.3 g/l of m-nitrobenzensulfonic acid into 100 ml/l of sulfuric acid solution, at 60° C. by showering for 30 seconds.

The circuit formed on the printed wiring board 15 in the above-described steps had an extremely excellent rectangular profile of which etch factor was 6.6, since the copper layer was not attacked by the selective etchant.

EXAMPLE 2

In this embodiment, the production of metal foil 1 for printed wiring boards according to this invention will be described, and a test substrate of 80 μm pitch (circuit width 40 μm, gap 40 μm) produced using the metal foil 1 will also be described. A production apparatus 2 used is a type shown in FIG. 2 in which unwound drum foil (electrolytic copper foil having been subjected to no surface treatment) 3 runs in a winding manner through the tanks in which the respective process steps are carried out. The metal foil 1 of this embodiment was produced by using drum foil 3, 18 μm thick classified as grade 3 and forming a tin layer 5, 2 μm thick on the matte side (one side of the electrolytic copper foil deposited on a cathode which was opposite to the side in contact with the cathode) 4 of the drum foil 3. Reference numeral 5, which was used to denote a nickel layer in Example 1, is used to denote a tin layer here. And portions other than the nickel layer in common are denoted with the same reference numerals as those of Example 1 as thoroughly as possible.

In the following, the production conditions of the metal foil 1 for printed wiring boards as claimed will be described according to the order of the respective process steps for which different types of tanks are arranged in series successively. However, basic steps are just the same as those of Example 1, except that a tin layer 5 is formed instead of a nickel layer in the metal-layer-forming tank 9. Accordingly, the description of the repeated portions will be omitted and the metal-layer-forming tank 9, which is an only different portion, alone will be described.

In the metal-layer-forming tank 9, a tin layer 5 was formed. A tin layer 5 with 2 μm thickness was electrodeposited uniformly and even on the drum foil 3, while the drum foil 3 passed through the metal-layer-forming tank 9, using stannous sulfate solution containing 20 g/l of tin whose temperature was 35° C. and pH was 3, under the condition that the current density was 5 A/dm$^2$ (for electrolysis).

After completing the formation of the tin layer 5, finally the drum foil 3 was passed through a dryer 11, which was heated to atmospheric temperature of 110° C. by an electric heater, over 40 seconds and wound up into a roll as finished metal foil 1 for printed wiring boards.

A metal clad laminate 14 was produced using a base 13 which was formed of this metal foil 1 for printed wiring boards and two sheets of FR-4 prepreg 150 μm thick, and a printed wiring board 15 was tentatively produced. In the following the production process will be described with reference to FIGS. 5 and 6. In the metal clad laminate 14 produced here, the copper layer corresponding to the drum foil 3 and the tin layer 5 were laminated in such a manner as to allow them to locate on the surface side and on the base 13 side, respectively, as shown in FIG. 5(a). The subsequent process for producing a printed wiring board 15 is basically the same as that of the first embodiment, except that the solution used in flash etching is different. Accordingly, the description of the repeated portions will be omitted and the solution used in flash etching alone will be described.

In this embodiment, the flash etching of the tin layer 5 was carried out using an aqueous solution of sodium hydroxide 120 g/l in concentration as a selective etchant for the tin layer 5. The tin layer 5 of the circuit formed portion alone was selectively removed by using stainless steel plates as cathodes and anode-polarizing the metal clad laminate 14 in the above solution.

The circuit formed on the printed wiring board 15 in the above-described steps had an extremely excellent rectangular profile of which etch factor was 6.8, since the copper layer was not attacked by the selective etchant.

EXAMPLE 3

In this example, the production of the metal foil with carrier foil 20 for printed wiring boards according to this invention will be described, and a test substrate of 80 μm pitch (circuit width 40 μm, line to line gap 40 μm) produced using the metal foil with carrier foil 20 will also be described. A production apparatus 2 used was a type shown in FIG. 4 and electrolytic copper foil having been subjected to no surface treatment was used as the unwound carrier foil 21. The metal foil with carrier foil 20 of this embodiment was produced by using electrolytic metal foil 18 μm thick classified as grade 3 as the carrier foil 21 and forming a metal foil layer 22 of nickel 2 μm thick on the shiny side (one side of the electrolytic copper foil deposited on a cathode, which was in contact with the cathode) 22 of the carrier foil 21. Here portions in common are denoted with the same reference numerals as those of Example 1 as thoroughly as possible.

The unwound carrier foil 21 first enters a pickling tank 6. The pickling tank 6 was filled with dilute sulfuric acid solution 150 g/l in concentration and 30° C. in temperature, in which one side of the carrier foil 21 was in contact with this solution for about 25 seconds and the fat components attached thereto as well as the surface oxide film formed thereon were removed by acid rinse.

The carrier foil 21 coming out of the pickling tank 6 then enters an interface forming bath 23 which was filled with an aqueous solution containing 5 g/l of CBTA, of which temperature was 40° C. and pH was 5. Thus, the carrier foil 21 was in contact with the aqueous solution containing the above organic agent for 40 seconds in the interface forming bath 23 and an interface layer 24 was formed on the surface of the carrier foil 21.

Subsequently after the formation of the interface layer 24, a nickel bulk layer 25 was formed on the interface layer 24. In a bulk-layer-forming tank 26, electrolysis was carried out in a nickel sulfate solution containing 20 g/l of nickel, of which temperature was 40° C. and pH was 3, under the condition that the current density was 10 A/dm$^2$. And the nickel bulk layer 25, 2 μm thick was electrodeposited uniformly and even on the above interface while passing the carrier foil 21 through the metal-layer-forming tank 9. The anodes 8 are arranged in the same manner as those of the first embodiment.

After completing the formation of the bulk layer 25, then the carrier foil 21 is passed through a nodular treatment tank 7 in which the step of forming nickel microparticles 27 on the surface of the bulk layer 25 is carried out. The step of the nodular treatment carried out in the nodular treatment tank 7 consisted of: a sub-step 7A of depositing metal microparticles 27 on the bulk layer 25; and a sub-step 7B of seal-plating the bulk layer 25 so as to prevent the metal microparticles 27 from falling.

In the sub-step 7A of depositing metal microparticles 27 on the bulk layer 25, the deposition of nickel microparticles 27 was carried out by an electrolytic method in a solution containing 0.4 g/l of nickel chloride, 1.0 g/l of ammonium chloride, and 0.03% by weight of polyoxyethylene oleyl ether, of which temperature was room temperature and pH was 6, under the condition that the current density was 3.5 A/dm².

In the sub-step 7B of seal-plating the bulk layer 25 so as to prevent the metal microparticles 27 from falling, electrolysis was carried out for 3 seconds in a nickel sulfate solution, which was the same solution as that used in the above-mentioned bulk-layer-forming tank 26, containing 20 g/l of nickel, of which temperature was 40° C., pH was 3, under the condition that the current density was 10 A/dm².

Finally the carrier foil 21 was passed through a dryer 11, which was heated to atmospheric temperature of 110° C. by an electric heater, over 40 seconds and wound up into a roll as finished peelable metal (nickel) foil with carrier foil 1. Between the tanks in which the respective steps are carried out, water-rinsing baths 12 capable of water rinsing are provided, and the carrier foil 21 is water-rinsed for about 15 seconds in each tank, whereby the solution used in pretreatment steps is prevented from being brought into the subsequent steps.

A metal clad laminate 14 was produced using the metal foil with carrier foil 20 and two sheets of FR-4 prepreg 150 µm thick, and a printed wiring board 15 was tentatively produced. For the metal foil with carrier foil 20, release strength in the interface 8 of the carrier foil layer 21 and the metal foil layer 22 was measured. As a result, the release strength at the interface layer 24 was 10 gf/cm. In the following the production process will be described with reference to FIGS. 7 and 8. In the metal clad laminate 14 produced here, the carrier foil 21 and the metal foil layer 22 were laminated in such a manner as to allow them to locate on the surface side and on the base 13 side, respectively, as shown in FIG. 7(a).

Then, the carrier foil 21 of the metal clad laminate 14 was removed by peeling. The release strength in the interface layer 24 after hot pressing was 12 gf/cm. In this stage, the nickel bulk layer 25 constituted the external layer of the metal clad laminate 14, as shown in FIG. 7(b).

The steps subsequent to the step shown in FIG. 7(c), that is, the steps of: forming a plating resist layer 16 on the nickel layer 5; exposing and developing comb type pattern of 80 µm pitch; pattern copper layer forming in which a copper is deposited on the circuit formed portion; removing a cured plating resist layer; and selectively etching the nickel layer 5 of a circuit unformed portion are the same as those of Example 1, therefore the description thereof will be omitted to avoid the repetition of the same description.

The circuit formed on the printed wiring board 15 in the above-described steps had an extremely excellent rectangular profile of which etch factor was 6.8, since the pattern copper forming layer is not attacked by the selective etchant.

EXAMPLE 4

In this example, the production of the metal foil with carrier foil 20 for printed wiring boards according to this invention will be described, and a test substrate of 80 µm pitch (circuit width 40 µm, line to line gap 40 µm) produced using the metal foil with carrier foil 20 will also be described. A production apparatus 2 used was a type shown in FIG. 4 and electrolytic copper foil having been subjected to no surface treatment was used as the unwound carrier foil 21. The metal foil with carrier foil 20 of this embodiment was produced by using electrolytic metal foil 18 µm thick classified as grade 3 as the carrier foil 21 and forming a metal foil layer 22 of tin 2 µm thick on the shiny side (one side of the electrolytic copper foil deposited on a cathode, which was in contact with the cathode) 22 of the carrier foil 21. Here, portions in common are denoted with the same reference numerals as those of Example 1 as thoroughly as possible. The process for producing the metal foil with carrier foil 20 for printed wiring boards of this example is basically the same as that of Example 3, except the points described below.

Now the formation of a bulk layer 25 of tin on the interface layer 24 will be described. In a bulk-layer-forming tank 26, a tin bulk layer 25, 2 µm thick was electrodeposited uniformly and even on the interface layer 24 in a stannous sulfate solution containing 20 g/l of tin, of which temperature was 35° C. and pH was 3, under the condition that the current density was 5 A/dm² while passing the carrier foil 21 through the bulk-layer-forming tank 26.

After completing the formation of the bulk layer 25, then the carrier foil 21 is passed through a nodular treatment tank 7 in which the step of forming tin microparticles 27 on the surface of the bulk layer 25 is carried out. The step of the nodular treatment carried out in the nodular treatment tank 7 consisted of: a sub-step 7A of depositing metal microparticles 27 on the bulk layer 25; and a sub-step 7B of seal-plating the bulk layer 25 so as to prevent the metal microparticles 27 from falling.

In the sub-step 7A of depositing metal microparticles 27 on the bulk layer 25, electrolysis was carried out for 8 seconds in a stannous sulfate solution containing 60 g/l of tin, of which temperature was 35° C. and pH was 3, under the condition that the current density was 10 A/dm².

In the sub-step 7B of seal-plating the bulk layer 25 so as to prevent the metal microparticles 27 from falling, electrolysis was carried out for 3 seconds in a stannous sulfate solution, which was the same solution as that used in the above-mentioned bulk-layer-forming tank 26, containing 20 g/l of tin, of which temperature was 35° C. and pH was 3, under the condition that the current density was 5 A/dm².

A metal clad laminate 14 was produced using the metal foil with carrier foil 20 and two sheets of FR-4 prepreg 150 µm thick, and a printed wiring board 15 was tentatively produced. The procedure of this production is basically the same as that of the third embodiment. Accordingly, the description of the repeated portions will be omitted and the different points alone will be described. For the metal foil with carrier foil 20, release strength in the interface 8 of the carrier foil layer 21 and the metal foil layer 22 was measured. As a result, the release strength at the interface layer 24 was 11 gf/cm. In the following the production process will be described with reference to FIGS. 7 and 8. In the metal clad laminate 14 produced here, the carrier foil 21 and the metal foil layer 22 were laminated in such a manner as to allow them to locate on the surface side and on the base 13 side, respectively, as shown in FIG. 7(a). Then a printed wiring board 15 was produced in the same procedure as that of Example 3.

The release strength in the interface layer 24 after hot pressing was 14 gf/cm when peeling off the carrier foil 21 of the metal clad laminate 14. In this stage, the tin bulk layer 25 constituted the external layer of the metal clad laminate 14, as shown in FIG. 7(b).

The subsequent steps, that is, the steps of: forming a plating resist layer 16 on the tin layer 5; exposing and developing comb type pattern of 80 µm pitch; pattern copper layer forming in which a copper is deposited on the circuit formed portion; removing a cured plating resist layer; and selectively etching the tin layer 5 of a circuit unformed portion are the same as those of the second embodiment, therefore the description thereof will be omitted to avoid the repetition of the same description.

The circuit formed on the printed wiring board 15 in the above-described steps had an extremely excellent rectangular profile of which etch factor was 6.7, since the pattern copper layer was not attacked by the selective etchant.

ADVANTAGES OF THE INVENTION

The use of the copper foil and metal foil with carrier foil for printed wiring boards according to this invention enables the production of printed wiring boards by the semi-additive process according to this invention. This production process allows a circuit to have an excellent aspect ratio. This means that a larger space is ensured on the top portion of the circuit, in other words, the area of the circuit becomes larger to which components are directly bonded when they are mounted thereon, and thereby bonding itself becomes very easy. Further, the accuracy of forming the land portions of the circuit markedly increases, which enables the improvement of reliability in connection between the circuit and the mounting components.

What is claimed is:

1. A metal foil for printed wiring boards comprising a nodulated surface comprising copper microparticles attached to a copper layer, wherein the nodulated surface has a selectively etched layer comprising nickel or tin and having thickness of 0.5 to 3 $\mu$m formed thereon.

2. The metal foil of claim 1, wherein the copper layer is not etched.

3. Metal foil with carrier foil for printed wiring boards comprising three layers: a carrier foil layer; a releasing layer; and a metal foil layer, wherein the metal foil layer comprises a bulk layer with metal microparticles formed on the bulk layer, wherein the bulk layer is 0.5 to 3 $\mu$m thick, and the bulk layer and microparticles comprise both tin or both nickel.

4. The metal foil with carrier foil for printed wiring boards according to claim 3, wherein the carrier foil layer is formed from copper foil and the releasing layer is an organic interface layer formed from an organic agent.

5. The metal foil with carrier foil for printed wiring boards according to claim 4, wherein the releasing layer is formed from an organic agent comprising at least one agent selected from the group consisting of nitrogen containing organic compounds, sulfur containing compounds and carboxylic acids.

* * * * *